United States Patent
Hsu et al.

(10) Patent No.: US 10,938,402 B1
(45) Date of Patent: Mar. 2, 2021

(54) SUCCESSIVE APPROXIMATION REGISTER ANALOG-TO-DIGITAL CONVERTER

(71) Applicants: NCKU Research and Development Foundation, Tainan (TW); Himax Technologies Limited, Tainan (TW)

(72) Inventors: Che-Wei Hsu, Tainan (TW); Soon-Jyh Chang, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 0 days.

(21) Appl. No.: 16/942,126

(22) Filed: Jul. 29, 2020

(51) Int. Cl.
  *H03M 1/46* (2006.01)
  *H03M 1/66* (2006.01)
  *H03M 1/10* (2006.01)

(52) U.S. Cl.
  CPC .......... *H03M 1/466* (2013.01); *H03M 1/1009* (2013.01); *H03M 1/66* (2013.01)

(58) Field of Classification Search
  CPC ....... H03M 1/466; H03M 1/66; H03M 1/1009
  See application file for complete search history.

(56) References Cited

U.S. PATENT DOCUMENTS

| | | | |
|---|---|---|---|
| 6,707,403 B1 * | 3/2004 | Hurrell | H03M 1/1061 341/120 |
| 10,581,443 B2 * | 3/2020 | Vinje | H03M 1/1023 |
| 10,623,010 B2 * | 4/2020 | Loke | H03M 1/183 |
| 10,715,163 B2 * | 7/2020 | Chao | H03M 1/1033 |

* cited by examiner

*Primary Examiner* — Brian K Young
(74) *Attorney, Agent, or Firm* — Donald E. Stout; Stout, Uxa & Buyan, LLP

(57) ABSTRACT

A successive approximation register (SAR) analog-to-digital converter (ADC) includes a first digital-to-analog converter (DAC) coupled to receive a first input voltage to generate a first output voltage; a second DAC coupled to receive a second input voltage to generate a second output voltage; a comparator having a positive input node coupled to receive the first output voltage of the first DAC, and a negative input node coupled to receive the second output voltage of the second DAC; a SAR controller that controls switching of the first DAC and the second DAC according to a comparison output of the comparator, thereby generating an output code; a first calibration circuit coupled between the positive input node of the comparator and a ground voltage; and a second calibration circuit coupled between the negative input node of the comparator and the ground voltage.

11 Claims, 2 Drawing Sheets

SUCCESSIVE APPROXIMATION REGISTER ANALOG-TO-DIGITAL CONVERTER

BACKGROUND OF THE INVENTION

1. Field of the Invention

The present invention generally relates to a successive approximation register (SAR) analog-to-digital converter (ADC), and more particularly to a SAR ADC capable of calibrating a top-plate residue voltage.

2. Description of Related Art

A successive approximation register (SAR) analog-to-digital converter (ADC) is a type of ADC that coverts an analog signal to a digital equivalent of the signal. The SAR ADC performs conversion by comparison and searching through all possible quantization levels to obtain a digital output. The SAR ADC requires less silicon area and power consumption than other ADC architectures.

A time-interleaved SAR ADC has been proposed to speed up the conversion by using multiple sub-ADCs. However, overall linearity of the SAR ADC may be reduced due to gain error (or offset error) among the sub-ADCs.

A need has thus arisen to propose a novel calibration scheme to reduce the gain error among the sub-ADCs in the SAR ADC.

SUMMARY OF THE INVENTION

In view of the foregoing, it is an object of the embodiment of the present invention to provide a successive approximation register (SAR) analog-to-digital converter (ADC) capable of calibrating a top-plate residue voltage, therefore enhancing gain and input range of the ADC.

According to one embodiment, a successive approximation register (SAR) analog-to-digital converter (ADC) includes a first digital-to-analog converter (DAC), a second DAC, a comparator, a SAR controller, a first calibration circuit and a second calibration circuit. The first DAC is coupled to receive a first input voltage at an input node thereof, thereby generating a first output voltage at an output node thereof. The second DAC is coupled to receive a second input voltage at an input node thereof, thereby generating a second output voltage at an output node thereof. The comparator has a positive input node coupled to receive the first output voltage of the first DAC, and a negative input node coupled to receive the second output voltage of the second DAC. The SAR controller controls switching of the first DAC and the second DAC according to a comparison output of the comparator, thereby generating an output code. The first calibration circuit is coupled between the positive input node of the comparator and a ground voltage. The second calibration circuit is coupled between the negative input node of the comparator and the ground voltage.

DETAILED DESCRIPTION OF THE INVENTION

Figure 1:
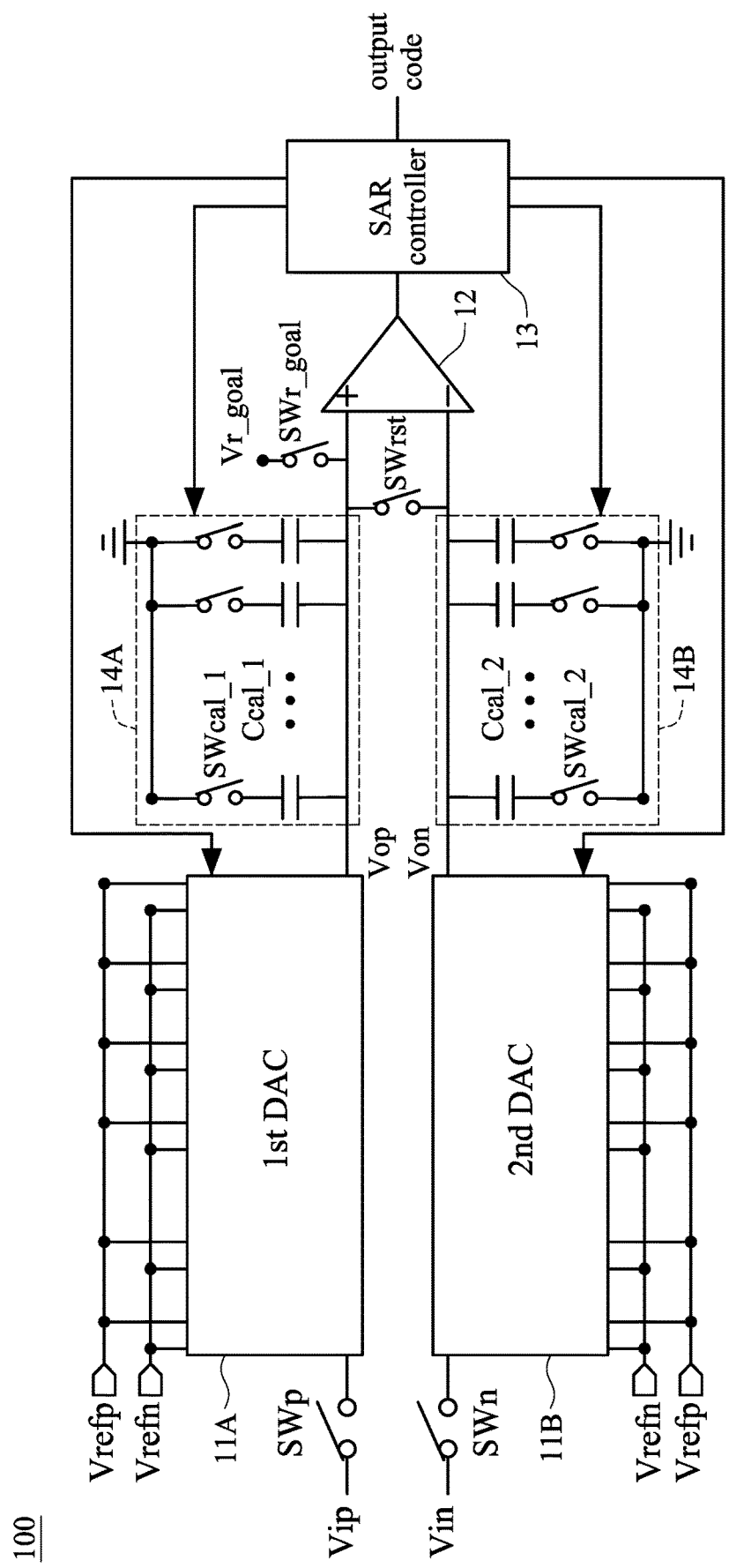
FIG. 1 shows a block diagram illustrating a successive approximation register (SAR) analog-to-digital converter (ADC) capable of calibrating a top-plate residue voltage according to one embodiment of the present invention.

FIG. 1 shows a block diagram illustrating a successive approximation register (SAR) analog-to-digital converter (ADC) 100 capable of calibrating a top-plate residue voltage according to one embodiment of the present invention.

In the embodiment, the SAR ADC 100 may include a first digital-to-analog converter (DAC) 11A that is coupled, at its input node, to receive a first (or positive) input voltage Vip via a first bootstrapped switch SWp, and accordingly generates a first output voltage Vop at its output node. The first DAC 11A may include a plurality of capacitors (not shown) having top plates coupled to the input node of the first DAC 11A, and bottom plates switchably coupled to a positive reference voltage Vrefp and a negative reference voltage Vrefn.

Similarly, the SAR ADC 100 may include a second DAC 11B that is coupled, at its input node, to receive a second (or negative) input voltage Vin via a second bootstrapped switch SWn, and accordingly generates a second output voltage Von at its output node. The second DAC 11B may include a plurality of capacitors (not shown) having top plates coupled to the input node of the second DAC 11B, and bottom plates switchably coupled to the positive reference voltage Vrefp and the negative reference voltage Vrefn.

The SAR ADC 100 of the embodiment may include a comparator 12 having a positive input node coupled to receive the first output voltage Vop of the first DAC 11A, and a negative input node coupled to receive the second output voltage Von of the second DAC 11B.

The SAR ADC 100 of the embodiment may include a SAR controller 13 configured to control switching of the first DAC 11A and the second DAC 11B according to a comparison output of the comparator 12, thereby generating an output code from a most significant bit (MSB) to a least significant bit (LSB) in sequence.

According to one aspect of the embodiment, the SAR ADC 100 may include a first calibration circuit 14A coupled between the positive input node of the comparator 12 and a ground voltage. Specifically, the first calibration circuit 14A may include a plurality of parallel-connected first calibration capacitors Ccal_1 having top plates coupled to the positive input node of the comparator 12, and bottom plates switchably coupled to the ground voltage via first calibration switches SWcal_1 respectively.

Similarly, the SAR ADC 100 may include a second calibration circuit 14B coupled between the negative input node of the comparator 12 and the ground voltage. Specifically, the second calibration circuit 14B may include a plurality of parallel-connected second calibration capacitors Ccal_2 having top plates coupled to the negative input node of the comparator 12, and bottom plates switchably coupled to the ground voltage via second calibration switches SWcal_2 respectively.

The SAR ADC 100 of the embodiment may include a reset switch SWrst coupled between the positive input node and the negative input node of the comparator 12, and configured to reset the comparator 12. The SAR ADC 100 of the embodiment may include a goal switch SWr_goal coupled between the positive input node of the comparator 12 and a goal voltage Vr_goal.

After sampling phase and conversion phase of each cycle (or some cycles), a calibration phase may be performed. Specifically, in the calibration phase, the reset switch SWrst is turned on (i.e., closed) to generate a reset voltage. After turning off (i.e., opening) the reset switch SWrst, the goal switch SWr_goal may be turned on (i.e., closed). Therefore, the comparator 12 may compare the goal voltage Vr_goal (at the positive input node) and the reset voltage (at the negative input node). The SAR controller 13 is then configured to control switching of the first calibration switches SWcal_1 (of the first calibration circuit 14A) and the second calibration switches SWcal_2 (of the second calibration circuit 14B) according to the comparison output of the comparator 12.

Figure 2:
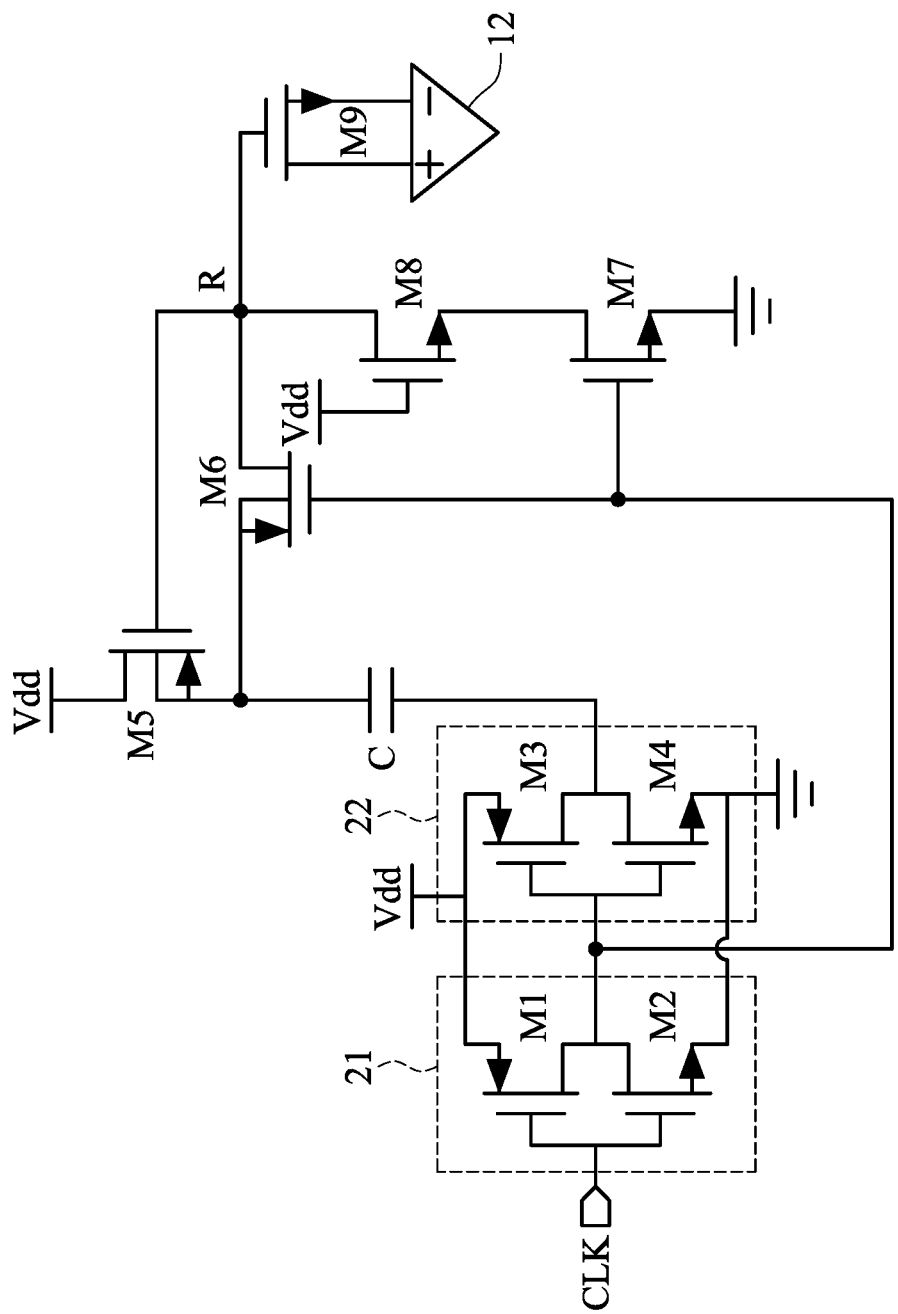
FIG. 2 shows a circuit diagram illustrating the reset switch of the SAR ADC in FIG. 1.

FIG. 2 shows a circuit diagram illustrating the reset switch SWrst of the SAR ADC 100 in FIG. 1. In the embodiment, the reset switch SWrst may include transistors M1-M9 and a capacitor C connected as shown.

Specifically, the reset switch may include a first inverter 21 composed of the (P-type) first transistor M1 and the (N-type) second transistor M2, and a second inverter 22 composed of the (P-type) third transistor M3 and the (N-type) fourth transistor M4. The first inverter 21 is coupled to receive a clock signal CLK, and the second inverter 22 is coupled to receive an output of the first inverter 21.

A first plate of the capacitor C is coupled to receive an output of the second inverter 22. The drain and source of the (P-type) fifth transistor M5 are coupled between a power voltage Vdd and a second plate of the capacitor C, and the gate of the fifth transistor M5 is coupled to a reset node R. The (P-type) sixth transistor M6, acting as a pass gate, has a source and a drain respectively coupled to the second plate (of the capacitor C) and the reset node R, and has a gate controlled by the output of the first inverter 21.

The (N-type) seventh transistor M7 and the (N-type) eighth transistor M8 are connected in series between the reset node R and the ground. A gate of the seventh transistor M7 is controlled by the output of the first inverter 21, and a gate of the eighth transistor M8 is coupled to the power voltage Vdd.

The drain and source of the (N-type) ninth transistor M9, acting as a pass gate, are coupled to the positive input node and the negative input node of the comparator 12, respectively. The gate of the ninth transistor M9 is coupled to the reset node R.

In the operation of the reset switch, when the clock signal CLK goes low, the capacitor C is charged, the transistors M5 and M7 are turned on, and the transistors M6 and M9 are turned off. Therefore, the voltage of the negative input node of the comparator 12 may be held at the source of the ninth transistor M9.

When the clock signal CLK goes high, the capacitor C is discharged, the transistors M5 and M7 are turned off, and the transistors M6 and M9 are turned on. Therefore, the voltage of the positive input node at the drain of the ninth transistor M9 may be passed to the source of the ninth transistor M9.

Although specific embodiments have been illustrated and described, it will be appreciated by those skilled in the art that various modifications may be made without departing from the scope of the present invention, which is intended to be limited solely by the appended claims.

What is claimed is:

1. A successive approximation register (SAR) analog-to-digital converter (ADC), comprising:
    a first digital-to-analog converter (DAC) coupled to receive a first input voltage at an input node thereof, thereby generating a first output voltage at an output node thereof;
    a second DAC coupled to receive a second input voltage at an input node thereof, thereby generating a second output voltage at an output node thereof;
    a comparator having a positive input node coupled to receive the first output voltage of the first DAC, and a negative input node coupled to receive the second output voltage of the second DAC;
    a SAR controller that controls switching of the first DAC and the second DAC according to a comparison output of the comparator, thereby generating an output code;
    a first calibration circuit coupled between the positive input node of the comparator and a ground voltage;
    a second calibration circuit coupled between the negative input node of the comparator and the ground voltage; and
    a reset switch coupled between the positive input node and the negative input node of the comparator, and configured to reset the comparator; and
    a goal switch coupled between the positive input node of the comparator and a goal voltage.

2. The SAR ADC of claim 1, wherein the first DAC receives the first input voltage via a first bootstrapped switch.

3. The SAR ADC of claim 1, wherein the second DAC receives the second input voltage via a second bootstrapped switch.

4. The SAR ADC of claim 1, wherein the first DAC comprises a plurality of capacitors having top plates coupled to the input node of the first DAC, and bottom plates switchably coupled to a positive reference voltage and a negative reference voltage.

5. The SAR ADC of claim 1, wherein the second DAC comprises a plurality of capacitors having top plates coupled to the input node of the second DAC, and bottom plates switchably coupled to a positive reference voltage and a negative reference voltage.

6. The SAR ADC of claim 1, wherein the first calibration circuit comprise a plurality of parallel-connected first calibration capacitors having top plates coupled to the positive input node of the comparator, and bottom plates switchably coupled to the ground voltage via first calibration switches respectively.

7. The SAR ADC of claim 1, wherein the second calibration circuit comprise a plurality of parallel-connected second calibration capacitors having top plates coupled to the negative input node of the comparator, and bottom plates switchably coupled to the ground voltage via second calibration switches respectively.

8. The SAR ADC of claim 1, wherein in calibration phase, the reset switch and the goal switch are turned on, and the SAR controller controls switching of the first calibration circuit and the second calibration circuit according to a comparison output of the comparator.

9. The SAR ADC of claim 1, wherein the reset switch comprises:
    a first transistor and a second transistor that construct a first inverter, which receives a clock signal;
    a third transistor and a fourth transistor that construct a second inverter, which receives an output of the first inverter;
    a capacitor having a first plate coupled to receives an output of the second inverter;
    a fifth transistor having a drain and a source coupled between a power voltage a second plate of the capacitor, and a gate coupled to a reset node;
    a sixth transistor having a source and a drain respectively coupled to the second plate of the capacitor and the reset node, and a gate controlled by the output of the first inverter;

a seventh transistor and an eighth transistor that are connected in series between the reset node and the ground, a gate of the seventh transistor being controlled by the output of the first inverter, and a gate of the eighth transistor being coupled to the power voltage; and a ninth transistor having a drain and a source coupled to the positive input node and the negative input node of the comparator respectively, and a gate coupled to the reset node.

10. The SAR ADC of claim 9, wherein when the clock signal goes low, the capacitor is charged, the fifth transistor and the seventh transistor are turned on, and the sixth transistor and the ninth transistor are turned off, thereby holding a voltage of the negative input node of the comparator at the source of the ninth transistor.

11. The SAR ADC of claim 9, wherein when the clock signal goes high, the capacitor is discharged, the fifth transistor and the seventh transistor are turned off, and the sixth transistor and the ninth transistor are turned on, thereby passing a voltage of the positive input node to the source of the ninth transistor.

\* \* \* \* \*